(12) United States Patent
Zhou et al.

(10) Patent No.: US 9,836,174 B2
(45) Date of Patent: Dec. 5, 2017

(54) ARRAY SUBSTRATE, DISPLAY AND ELECTRONIC DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Xingyao Zhou, Shanghai (CN); Qijun Yao, Shanghai (CN); Feng Lu, Shanghai (CN); Kang Yang, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 62 days.

(21) Appl. No.: 15/172,492

(22) Filed: Jun. 3, 2016

(65) Prior Publication Data
US 2017/0220148 A1 Aug. 3, 2017

(30) Foreign Application Priority Data
Jan. 29, 2016 (CN) .......................... 2016 1 0068752

(51) Int. Cl.
G06F 3/044 (2006.01)
G02F 1/1333 (2006.01)
G06F 3/041 (2006.01)

(52) U.S. Cl.
CPC .......... G06F 3/044 (2013.01); G02F 1/13338 (2013.01); G06F 3/0412 (2013.01)

(58) Field of Classification Search
None
See application file for complete search history.

(56) References Cited

U.S. PATENT DOCUMENTS

| 2009/0040166 A1* | 2/2009 | Lee ....................... G02F 1/1345 345/98 |
| 2011/0187633 A1* | 8/2011 | Huang ..................... G09G 3/36 345/94 |
| 2014/0168552 A1* | 6/2014 | Jo ..................... G02F 1/134363 349/33 |

FOREIGN PATENT DOCUMENTS

| CN | 104698708 A | 6/2015 |
| CN | 104698711 A | 6/2015 |

* cited by examiner

*Primary Examiner* — Nicholas Lee
(74) *Attorney, Agent, or Firm* — Kilpatrick Townsend & Stockton LLP

(57) ABSTRACT

An array substrate, a display and an electronic device are disclosed. The array substrate includes a common electrode layer and a pixel electrode layer arranged opposite to each other, multiple switch elements, multiple data lines extending in a column direction, multiple common wires connected to the common electrode blocks respectively. The pixel electrode layer includes multiple pixel electrodes, and the common electrode layer includes multiple common electrode blocks. A pixel gap exists between adjacent columns of the pixel electrodes. The projections of the common wires on the pixel electrode layer are in separate pixel gaps from the projections of the data lines on the pixel electrode layer in the direction perpendicular to the pixel electrode layer. Two data lines having the projections in the same pixel gap are in separate layers.

20 Claims, 9 Drawing Sheets

ARRAY SUBSTRATE, DISPLAY AND ELECTRONIC DEVICE

CROSS REFERENCE OF RELATED APPLICATION

The present application claims priority to Chinese Patent Application No. 201610068752.0, titled "ARRAY SUBSTRATE, DISPLAY AND ELECTRONIC DEVICE", filed on Jan. 29, 2016 with the State Intellectual Property Office of People's Republic of China, which is incorporated herein by reference in its entirety.

FIELD

The present disclosure relates to the technical field of touch display, and in particular to an array substrate, a display and an electronic device.

BACKGROUND

With the development of technology, more and more touch display devices are used in daily lives and work of people, bring great convenience and thus are indispensable tools for people. A main component of a touch display device is a touch display panel.

Reference is made to FIG. 1 and FIG. 2, where FIG. 1 is a top view of a typical touch display panel in the conventional technology and FIG. 2 is a sectional view of the touch display panel along a line AA' in FIG. 1. The touch display panel includes a substrate 11, and a common electrode layer and a common wire layer arranged on a surface of the substrate 11. The common electrode layer and the common wire layer are arranged in separate conductive layers and an insulation layer 12 is arranged between the common electrode layer and the common wire layer. The common electrode layer includes multiple electrode blocks 13 arranged in an array. The common electrode wire layer includes multiple common wires 14 connected to the electrode blocks 13 in a one-to-one correspondence. The electrode blocks 13 are connected to the corresponding common wires 14 through via holes 15 respectively. By driving the electrode blocks 13 in a time-division manner, a display drive is performed by providing a common voltage signal to the electrode blocks 13 via the common wires 14 during a display time period, and a touch drive is performed by providing a touch signal to the electrode blocks 13 via the common wires 14 during a touch time period. In the touch display panel, the common wires 14 are arranged parallel with data lines 16 and opposite to the data lines 16 in a direction perpendicular to the substrate 11.

In the above touch display panel, parasitic capacitance is formed between the common wires 14 and the opposite data lines 16, which may affect the accuracy of touch detection. Especially in a panel of a medium or large size, the issue is more serious.

SUMMARY

In order to address the above issue, an array substrate, a display and an electronic device are provided according to the present disclosure, so as to avoid the parasitic capacitance formed between common wires and data lines, and improve the accuracy of touch detection.

In order to achieve the above object, a technical solution is provided in the present disclosure as follows.

An array substrate includes: a common electrode layer and a pixel electrode layer arranged opposite to each other, multiple switch elements, multiple data lines, multiple common wires, and/or any other components. The pixel electrode layer includes multiple pixel electrodes arranged in an array, and the common electrode layer includes multiple common electrode blocks. Each of the multiple switch elements includes an active region, a gate, a drain and a source. The multiple data lines extend in a column direction of the array. The pixel electrodes in a same column are electrically connected to a same one of the data lines via the switch elements. The pixel electrodes in different columns are electrically connected to different ones of the data lines via the switch elements. The projections of the data lines on the pixel electrode layer in a direction perpendicular to the pixel electrode layer do not overlap with the pixel electrodes.

The multiple common wires are electrically connected to the common electrode blocks in a one-to-one correspondence, where the common wires extend in a direction parallel to the column direction, and projections of the common wires on the pixel electrode layer in the direction perpendicular to the pixel electrode layer do not overlap with the pixel electrodes. A pixel gap exists between adjacent columns of the pixel electrodes, the projections of the common wires on the pixel electrode layer are in separate pixel gaps from the projections of the data lines on the pixel electrode layer in the direction perpendicular to the pixel electrode layer, and two of the data lines having the projections in the same pixel gap are in separate layers.

It follows from the above description that, in the array substrate according to the present disclosure, the common wires and the data lines are in separate pixel gaps, thereby avoiding the parasitic capacitance formed between the common wires and the data lines and improving the accuracy of touch detection. Furthermore, two of the data lines having the projections in a same pixel gap are arranged in separate layers, thereby reducing the width of a light shielding region and improving the aperture ratio.

A display is further provided according to the present disclosure, which includes an array substrate and an opposite substrate arranged opposite to each other, where the array substrate is the above array substrate. Since the display has the above array substrate, it has higher accuracy of touch detection and a higher aperture ratio.

An electronic device is further provided according to the present disclosure, which includes the above array substrate. Since the electronic device has the above array substrate, it has higher accuracy of touch detection and a higher aperture ratio.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

The technical solutions according to the embodiments of the present disclosure are described clearly and completely in conjunction with the drawings hereinafter. It is apparent that the described embodiments are only a few rather than all of the embodiments according to the present disclosure. Any other embodiments obtained by those skilled in the art based on the embodiments in the present disclosure without any creative work fall into the scope of the present disclosure.

Figure 1:
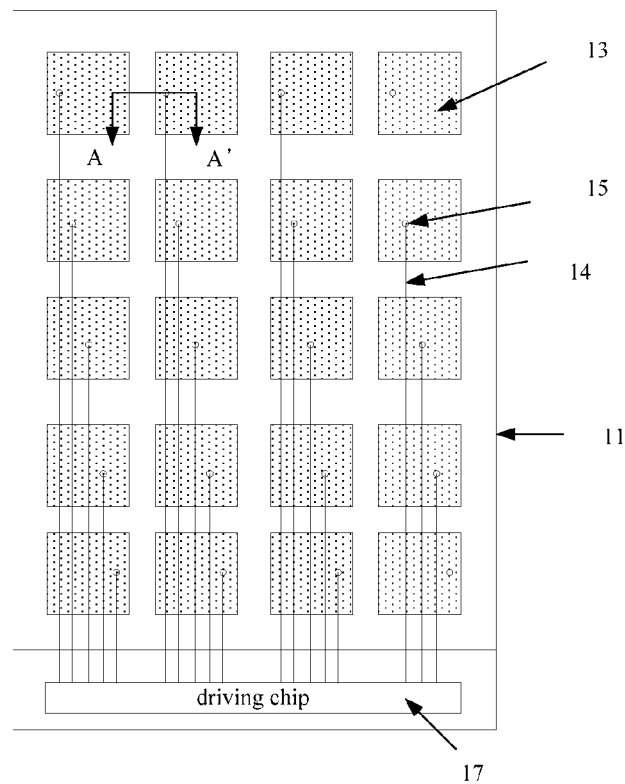
FIG. 1 is a top view of a typical touch display panel in the conventional technology.
Figure 2:
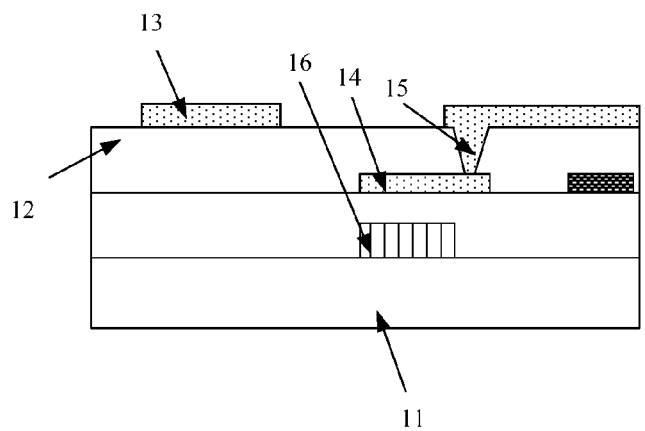
FIG. 2 is a sectional view of the touch display panel along a line AA' in FIG. 1.

As described in the BACKGROUND section, in the touch display panel in the conventional technology as shown in FIG. 1 and FIG. 2, parasitic capacitance is formed between common wires 14 and opposite data lines 16, which may affect the accuracy of touch detection. Especially, the issue is more serious in a panel of a medium size approximately in a range from 8 inches to 21 inches or a panel of a large size greater than 21 inches.

Figure 3:
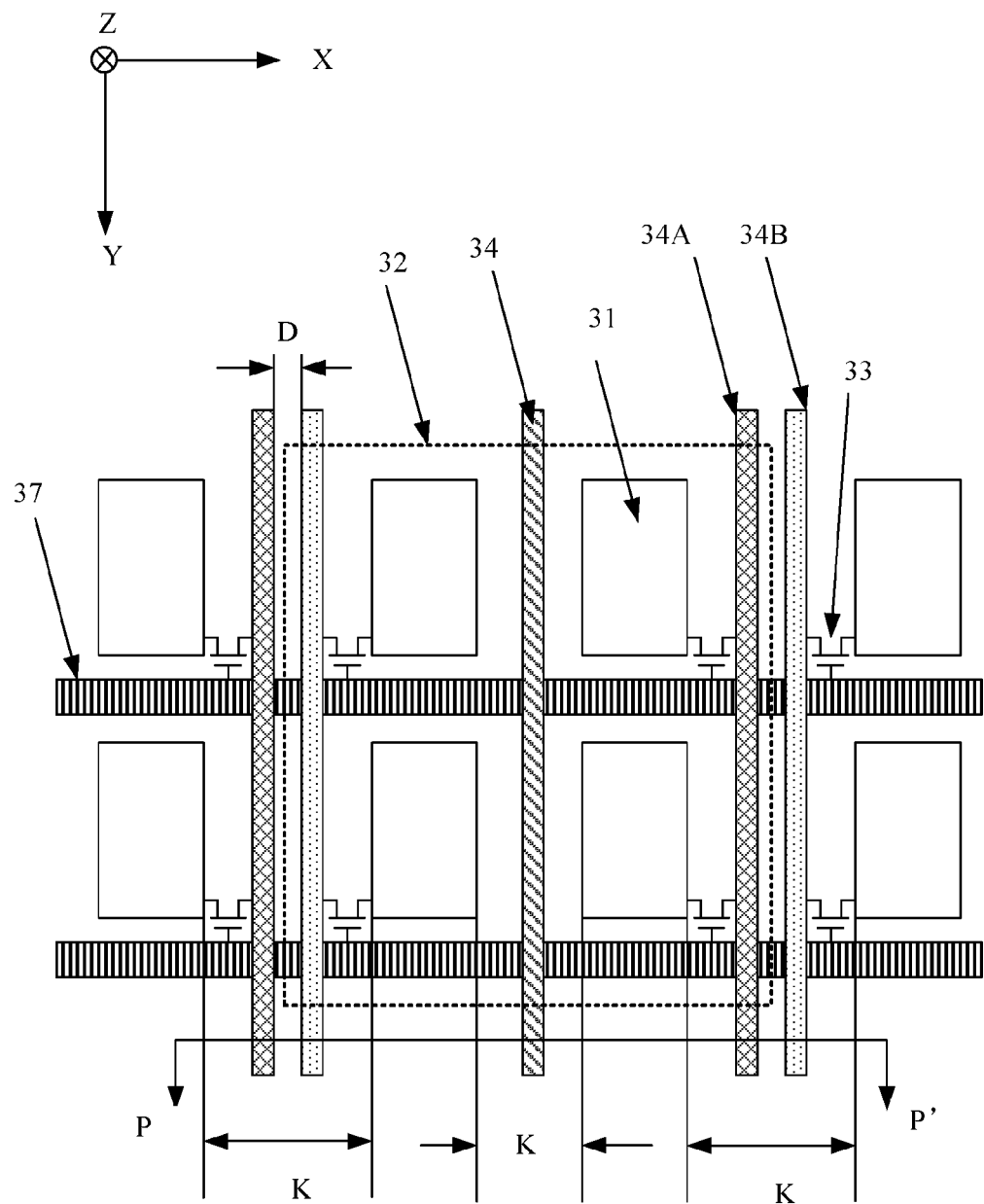
FIG. 3 is a structural schematic diagram of an array substrate according to an embodiment of the present disclosure.

In order to address the above issue, an array substrate is provided according to an embodiment of the present disclosure. Reference is made to FIG. 3, which is a structural schematic diagram of the array substrate according to the embodiment of the present disclosure.

The array substrate includes a common electrode layer and a pixel electrode layer arranged opposite to each other. The pixel electrode layer includes multiple pixel electrodes 31 arranged in an array, and the common electrode layer includes multiple common electrode blocks 32.

The array substrate further includes multiple switch elements 33 each including an active region, a gate, a drain and a source.

The array substrate further includes multiple data lines extending in a column direction Y of the array. The pixel electrodes 31 in a same column are electrically connected to a same one of the data lines via the switch elements 33, and the pixel electrodes 31 in different columns are electrically connected to different ones of the data lines via the switch elements 33. Projections of the data lines on the pixel electrode layer in a direction perpendicular to the pixel electrode layer do not overlap with the pixel electrodes 31.

The direction perpendicular to the pixel electrode layer is referred to as a first direction Z, which is perpendicular to the column direction Y and a row direction X of the array.

The array substrate further includes multiple common wires 34 electrically connected to the common electrode blocks 32 in a one-to-one correspondence. The common wires 34 extend in a direction parallel to the column direction Y. Projections of the common wires 34 on the pixel electrode layer in the direction perpendicular to the pixel electrode layer does not overlap with the pixel electrodes 31.

A pixel gap K exists between adjacent columns of the pixel electrodes 31. The projections of the common wires 34 on the pixel electrode layer are in separate pixel gaps K from the projections of the data lines on the pixel electrode layer in the direction perpendicular to the pixel electrode layer. Two data lines having the projections in the same pixel gap K are in separate layers.

It should be noted that, FIG. 3 is merely a schematic diagram of the array substrate according to the embodiment of the present disclosure, in which only one common electrode block 32 and pixel electrode blocks 31 of 2 rows and 4 columns are illustrated for easy of illustration. In practice, multiple common electrode blocks 32 are arranged in an array, and multiple pixel electrodes 31 are arranged in an array. The number of the common electrode blocks 32 and the number of the pixel electrodes 31 are not limited herein, which may be designed based on the size of the array substrate.

One of the two data lines having the projections in the same pixel gap K in the direction perpendicular to the pixel electrode layer is referred to as a first data line 34A and the other one is referred to as a second data line 34B, and the common wires 34 are arranged in a same layer as the first data line 34A or the second data line 34B.

As shown in FIG. 3, the array substrate further includes multiple gate lines extending in the column direction X of the array. The gate lines 37 are insulatively intersected with the data lines to define multiple pixel regions, in each of which one pixel electrode 31 is accommodated. The pixel electrodes 31 in a same row are electrically connected to a same gate line 37 via the switch elements 33, and the pixel electrodes 31 in different columns are electrically connected to different ones of the data lines via the switch elements 33.

The array substrate further includes a substrate which may be a glass substrate. The pixel electrode layer, the common electrode layer, the data lines, the gate lines and the switch elements are all arranged on a same side of the substrate. The pixel electrode layer and the common electrode layer may be in planes parallel to the substrate.

Figure 4:
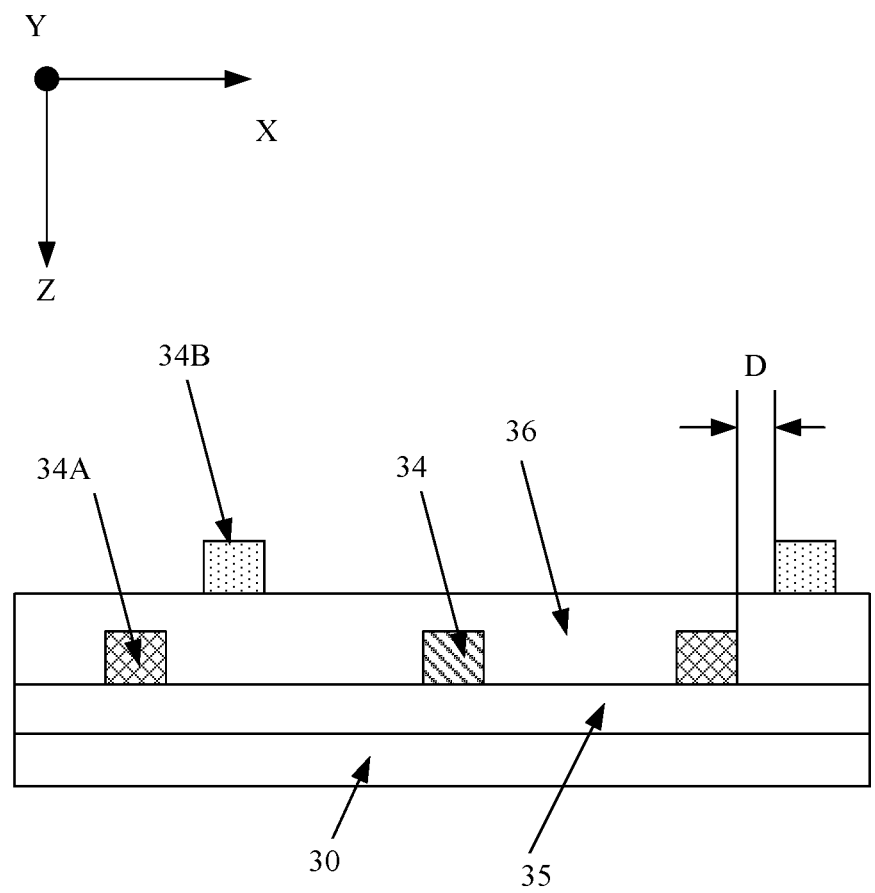
FIG. 4 is a sectional view of the array substrate along a line PP' in FIG. 3.

Reference is made to FIG. 4, which is a sectional view of the array substrate along a line PP' in FIG. 3. A gap D exists between a projection of the first data line 34A and a projection of the second data line 34B on the pixel electrode layer in the direction perpendicular to the pixel electrode layer. An insulation layer 35 is arranged between the data lines and the substrate 30, and an insulation layer 36 is arranged between the second data line 34B and the first data line 34A.

It should be noted that FIG. 4 only illustrates a relation of layers for the data lines and the common wire 34 without showing the pixel electrode 31, the switch element 33 and the common electrode block 32. In the embodiment shown in FIG. 4, the common wire 34 is arranged in a same layer as the first data line 34A. However, in another embodiment, the common wire 34 may be arranged in a same layer as the second data line 34B. The common wire 34 and the data line in the same layer may be prepared with a same conductive layer in a same process. In this way, no production process is added and the thickness of the array substrate is not increased.

In the embodiment as shown in FIG. 3 and FIG. 4, a gap D exists between the projection of the first data line 34A and the projection of the second data line 34B on the pixel electrode layer in the direction perpendicular to the pixel electrode layer. Optionally, the gap D is less than 3 μm.

Since the first data line 34A and the second data line 34B are arranged in separate layers, a distance between two data lines within a same pixel gap K can be shortened and also a problem of short circuit between the two data lines in the same pixel gap K due to a close distance can be avoided. Therefore, a light shielding region between the pixel electrodes 31 can be reduced and the aperture ratio can be increased. Furthermore, since the common wire 34 is not directly opposite to either of the data lines in the first direction Z, the distances between the common wire 34 and the data lines are increased, thereby reducing significantly parasitic capacitance formed between the common wire 34 and the data lines, and improving the accuracy of touch detection.

Figure 5:
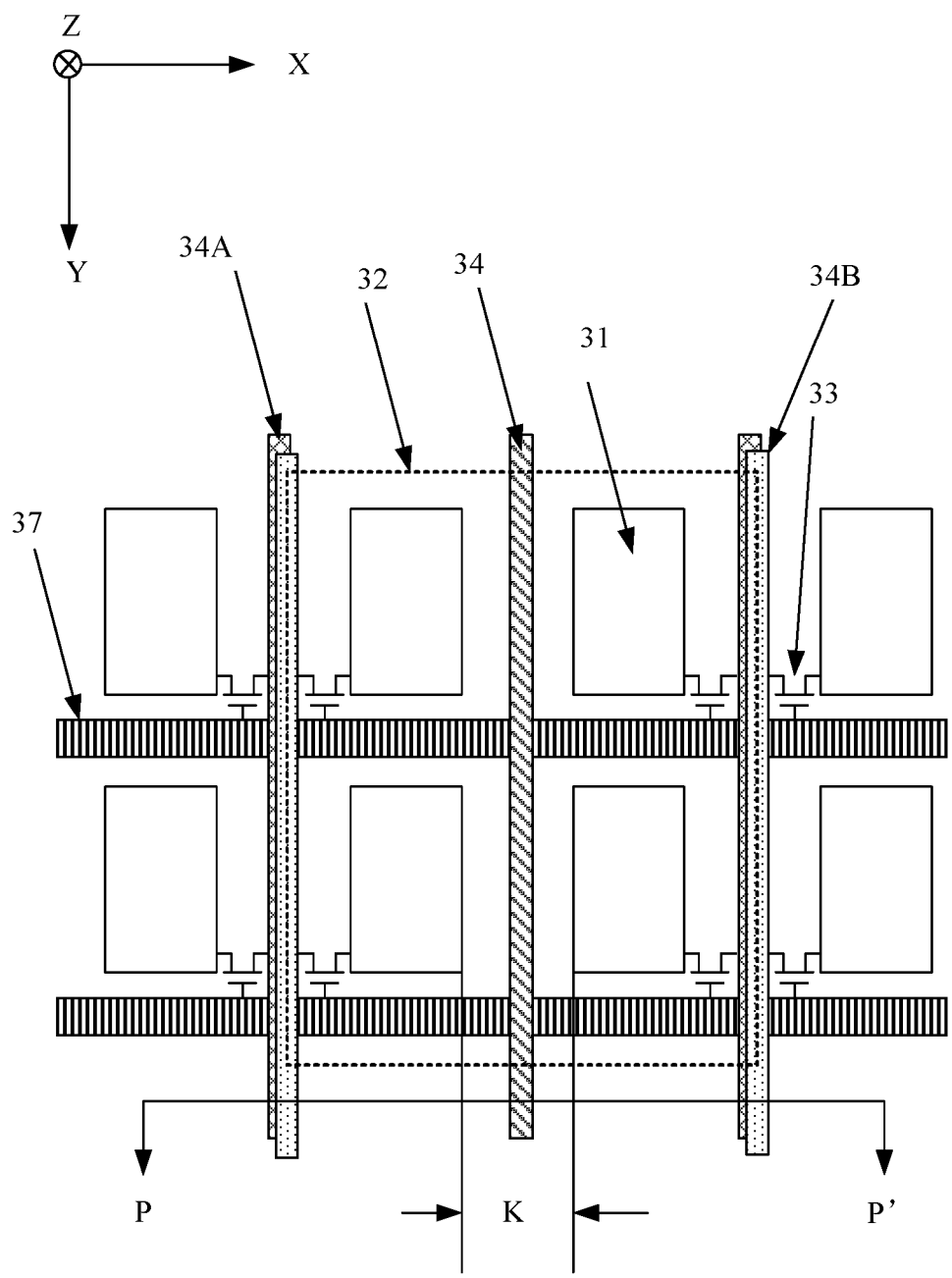
FIG. 5 is a structural schematic diagram of an array substrate according to an embodiment of the present disclosure.
Figure 6:
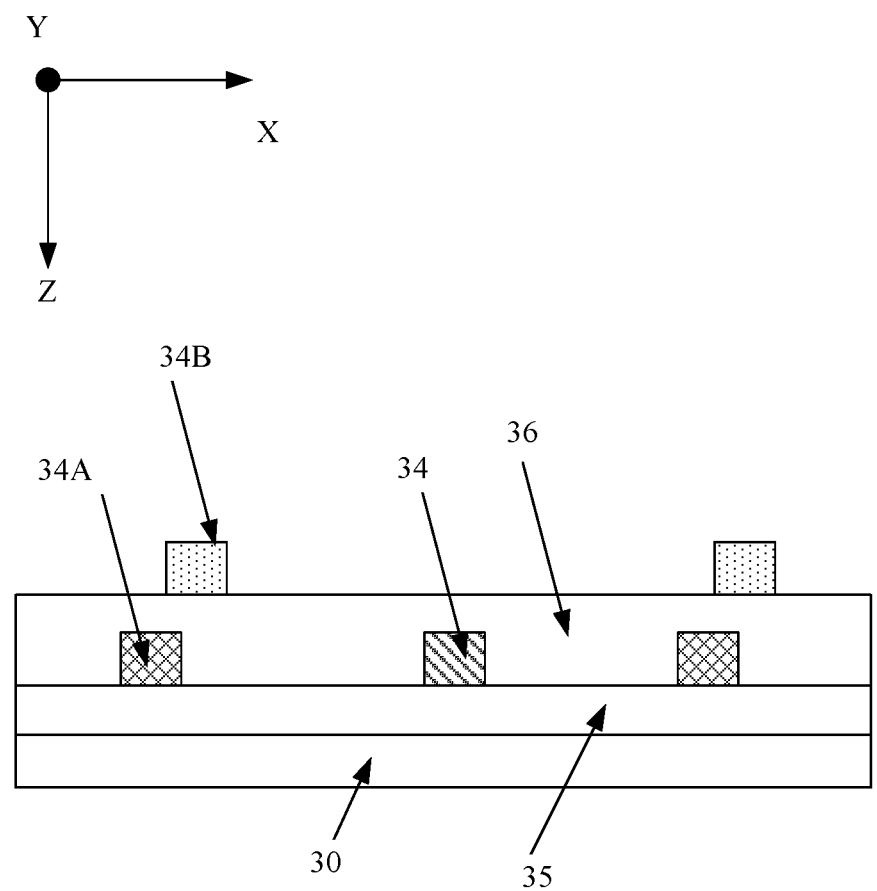
FIG. 6 is a sectional view of the array substrate along a line PP' in FIG. 5.

Based on the above embodiments, another array substrate is provided according to an embodiment of the present disclosure, as shown in FIG. 5 and FIG. 6. FIG. 5 is a structural schematic diagram of the array substrate according to the embodiment of the present disclosure, and FIG. 6 is a sectional view of the array substrate along a line PP' in FIG. 5. The embodiment as shown in FIG. 5 and FIG. 6 differs from the embodiment as shown in FIG. 3 and FIG. 4 in that, a projection of the first data line 34A on the pixel electrode layer partly overlaps with a projection of the second data line 34B on the pixel electrode layer in the direction perpendicular to the pixel electrode layer. Compared with the conventional technical solution in which the data lines are arranged in a same layer, the aperture ratio is increased, the parasitic capacitance is reduced and the accuracy of touch detection is improved in the embodiment as shown in FIG. 5 and FIG. 6.

Figure 7:
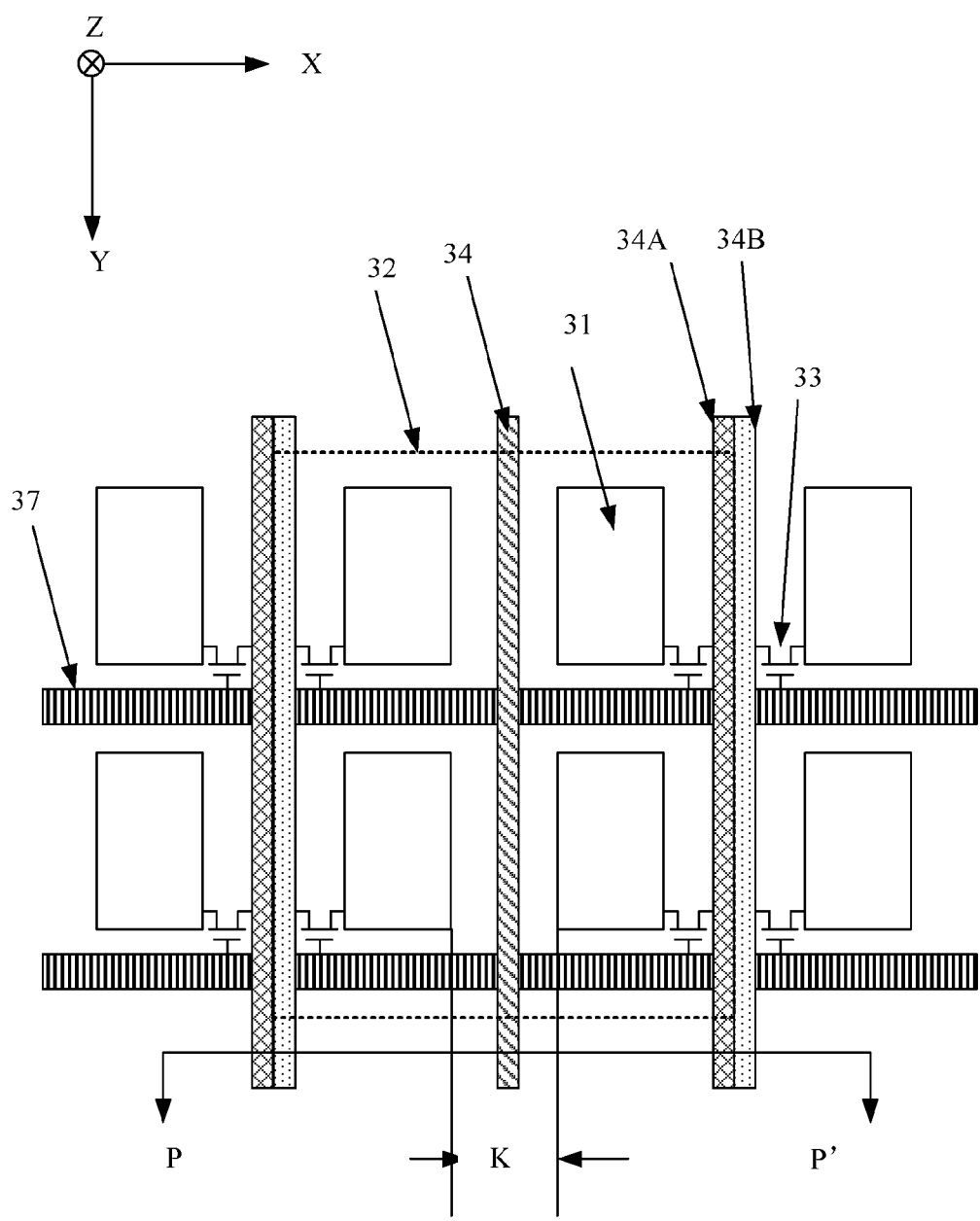
FIG. 7 is a structural schematic diagram of an array substrate according to an embodiment of the present disclosure.
Figure 8:
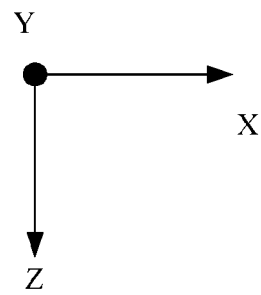
FIG. 8 is a sectional view of the array substrate along a line PP' in FIG. 7.
Figure 8:
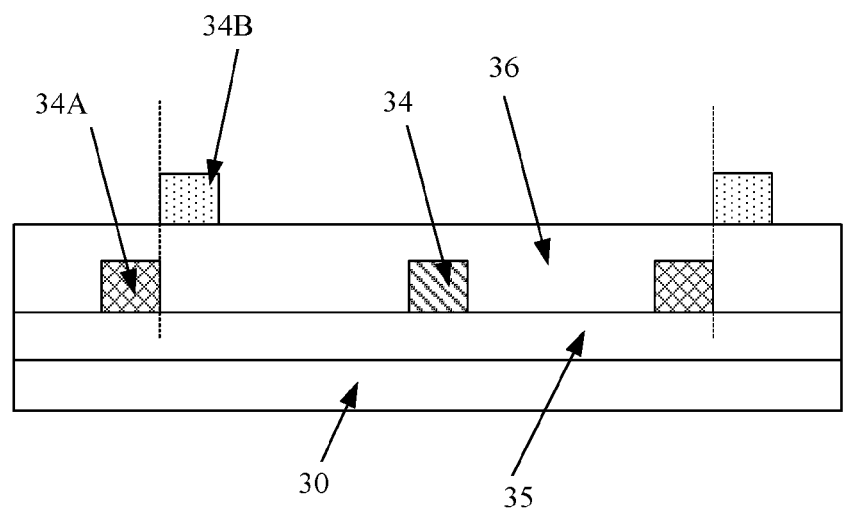

Based on the above embodiments, another array substrate is provided according to an embodiment of the present disclosure, as shown in FIG. 7 and FIG. 8. FIG. 7 is a structural schematic diagram of the array substrate according to the embodiment of the present disclosure, and FIG. 8 is a sectional view of the array substrate along a line PP' in FIG. 7. The embodiment as shown in FIG. 7 and FIG. 8 differs from the embodiment as shown in FIG. 3 and FIG. 4 in that, a projection of the first data line 34A on the pixel electrode layer adjoins a projection of the second data line 34B on the pixel electrode layer in the direction perpendicular to the pixel electrode layer. Compared with the conventional technical solution in which the data lines are arranged in a same layer, the aperture ratio is increased, the parasitic capacitance is reduced and the accuracy of touch detection is improved in the embodiment as shown in FIG. 7 and FIG. 8.

In the array substrate according to the embodiments of the present disclosure, the common electrode layer, the pixel electrode layer, the common wires and the data lines are all arranged on a side of the switch elements facing away from the substrate. In some embodiments, the active region of each of the switch elements may be an amorphous silicon active region or a low temperature polysilicon active region. The switch elements may be thin film transistors.

Figure 9:
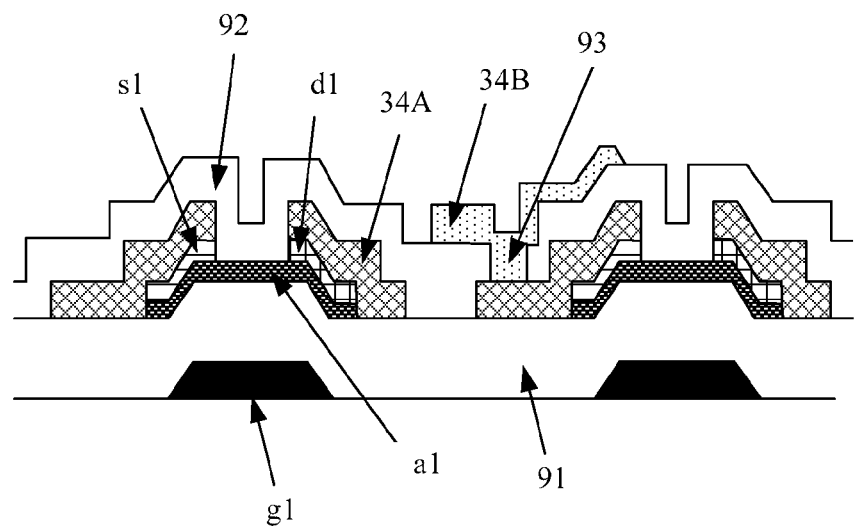
FIG. 9 is a structural schematic diagram of an array substrate according to an embodiment of the present disclosure.

Reference is made to FIG. 9, which is a structural schematic diagram of an array substrate according to an embodiment of the present disclosure. In the array substrate, each of the switch elements has an amorphous silicon active region. Each of the switch elements includes a gate g1, an active region a1, a source s1 and a drain d1. The active region a1 is an amorphous silicon active region. In each of the switch elements, the gate g1 is arranged between the active region a1 and the substrate. A gate dielectric layer 91 is arranged between the gate g1 and the active region a1. The source s1 and the drain d1 are all on a surface of the active region a1 facing away from the gate g1, and are all electrically connected to the active region a1. The first data line 34A is in contact with surfaces of the drains of the switch elements corresponding to the first data line 34A and is electrically connected to the drains. An insulation layer is arranged between the second data line 34B and the drains of the switch elements corresponding to the second data line 34B, and the second data line 34B is electrically connected to the drains d1 through via holes 93. The common wire, which is not shown in FIG. 9, is arranged in a same layer as the second data line 34B.

Figure 10:
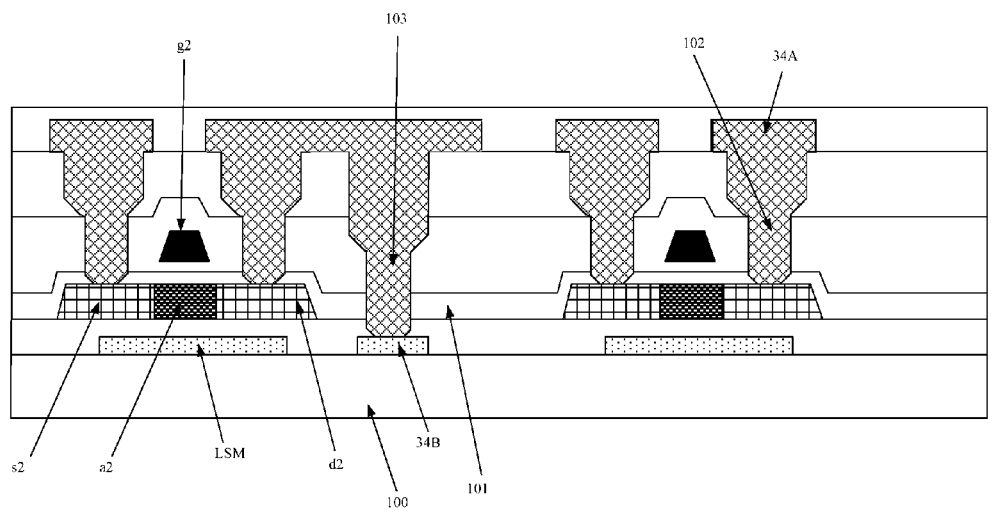
FIG. 10 is a structural schematic diagram of an array substrate according to an embodiment of the present disclosure.

Reference is made to FIG. 10, which is a structural schematic diagram of an array substrate according to an embodiment of the present disclosure. In the array substrate, each of the switch elements has a low temperature polysilicon active region. Each of the switch elements includes a gate g2, an active region a2, a source s2 and a drain d2. The active region a2 is a low temperature polysilicon active region. In each of the switch elements, the active region a2 is arranged between the gate g2 and the substrate 100; a gate dielectric layer 101 is arranged between the gate g2 and the active region a2, and the source s2 and the drain d2 are all electrically connected to the active region a2. An insulation layer is arranged between the first data line 34A and the drains d2 of the switch elements corresponding to the first data line 34A, and the first data line 34A is electrically connected to the drains d2 through via holes 102. An insulation layer is arranged between the second data line 34B and the drains d2 of the switch elements corresponding to the second data line 34B, and the second data line 34B is electrically connected to the drains d2 through via holes 103.

The common wire, which is not shown in FIG. 10, is arranged in a same layer as the first data line 34A or the second data line 34B. A light shielding wire LSM is arranged between the active region a2 and the substrate 100.

A protection of the active region a2 on the light shielding wire LSM in a direction perpendicular to the substrate 100 is within the light shielding wire LSM. The light shielding wire LSM is used to prevent light current from being produced due to irradiation to the active region a2 by back light, thereby ensuring the image display quality. As shown in FIG. 10, the first data line 34A is arranged on a side of the switch elements facing away from the substrate 100. The common wire is arranged in a same layer as the first data line 34A, and may be prepared with a same conductive layer in a same process as the first data line 34A. Therefore, no process is added and the thickness of the array substrate is not increased. The second data line 34B is arranged in a same layer as the light shielding wire LSM, and may be prepared with a same conductive layer in a same process as the light shielding wire LSM. Therefore, no process is added and the thickness of the array substrate is not increased. Furthermore, the parasitic capacitance formed between the data lines and the common wires can be avoided in the embodiment.

In another embodiment, the second data line 34B may be arranged on a side of the switch elements facing away from the substrate 100, the common wire may be arranged in a same layer as the second data line 34B, and the first data line 34A may be arranged in a same layer as the light shielding wire LSM.

As can be seen from the above description, in the array substrate according to the embodiment of the present disclosure, a common wire is arranged in a pixel gap, and a data line originally arranged in the pixel gap where the common wire is arranged is moved to an adjacent pixel gap. In this way, two data lines may exist in some pixel gaps. In the technical solution of the disclosure, two data lines in a same pixel gap are arranged in separate layers. In this way, a distance between the two data lines in the same pixel gap can be shortened, the aperture ratio can be improved, and a problem of short circuit between the two data lines in the same pixel gap can be avoided. Furthermore, by arranging the common wires and the data lines in separate pixel gaps, the parasitic capacitance formed between the common wires and the data lines can be reduced significantly and the accuracy of touch detection can be improved. Furthermore, although the data lines in the array substrate have to be prepared with two metal layers, no process is added and the thickness of the array substrate is not increased by preparing a part of the date lines in an original process and preparing the other part of the data lines with a same metal layer in a same process as the common wires.

Figure 11:
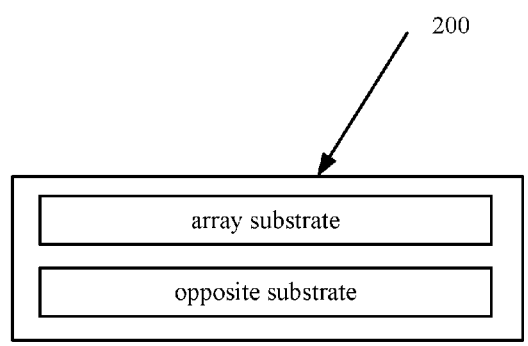
FIG. 11 is a sectional view of a display according to an embodiment of the present disclosure.

Based on the above embodiments, a display 200 is further provided according an embodiment of the present disclosure, as shown in FIG. 11. The display 200 includes an array substrate and an opposite substrate arranged opposite to each other. The array substrate is the array substrate according to any one of the above embodiments. The opposite substrate may be a color film substrate, or a glass substrate, which is not limited herein. Since the display has the array substrate according to the above embodiments, it has higher accuracy of touch detection.

Figure 12:
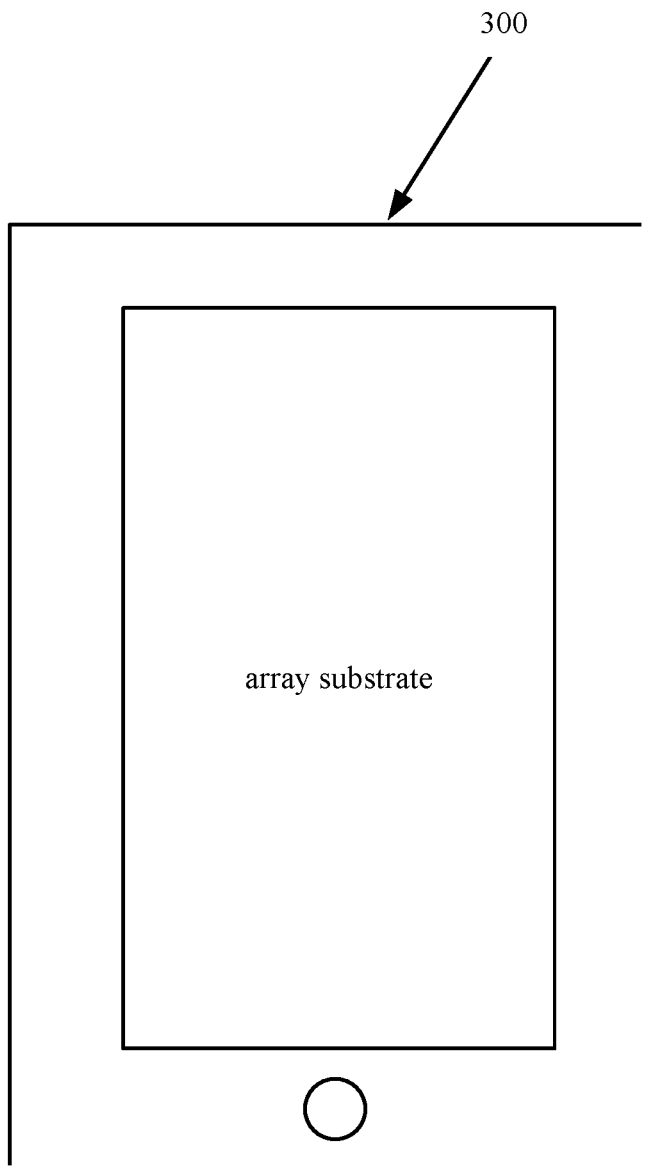
FIG. 12 is a structural schematic diagram of an electronic device according to an embodiment of the present disclosure.

Based on the above embodiments, an electronic device 300 is further provided according an embodiment of the present disclosure, as shown in FIG. 12. The electronic device 300 includes the array substrate according to any one of the above embodiments. The electronic device 300 may be any electronic device having a function of touch display, such as a mobile phone, a panel computer, a vehicular display electronic device. Since the electronic device has the array substrate according to the above embodiments, it has higher accuracy of touch detection.

According to the above description of the disclosed embodiments, those skilled in the art can implement or practice the present disclosure. Many changes to these embodiments are apparent for those skilled in the art, and general principles defined herein may be implemented in other embodiments without departing from the spirit or scope of the present disclosure. Hence, the present disclosure is not limited to the embodiments disclosed herein, but is to conform to the widest scope in accordance with the principles and novel features disclosed herein.

The invention claimed is:

1. An array substrate, comprising:
 a common electrode layer and a pixel electrode layer arranged opposite to each other, wherein the pixel electrode layer comprises a plurality of pixel electrodes arranged in an array, and the common electrode layer comprises a plurality of common electrode blocks;
 a plurality of switch elements each comprising an active region, a gate, a drain and a source;
 a plurality of data lines extending in a column direction of the array, wherein the pixel electrodes in a same column are electrically connected to a same one of the data lines via the switch elements, the pixel electrodes in different columns are electrically connected to different ones of the data lines via the switch elements, and projections of the data lines on the pixel electrode layer in a direction perpendicular to the pixel electrode layer do not overlap with the pixel electrodes; and
 a plurality of common wires electrically connected to the common electrode blocks in a one-to-one correspondence, wherein the common wires extend in a direction parallel to the column direction, and projections of the common wires on the pixel electrode layer in the direction perpendicular to the pixel electrode layer do not overlap with the pixel electrodes, wherein,
  a pixel gap exists between adjacent columns of the pixel electrodes;
  the projections of the common wires on the pixel electrode layer are in separate pixel gaps from the projections of the data lines on the pixel electrode layer in the direction perpendicular to the pixel electrode layer; and
  two of the data lines having the projections in a same pixel gap are in separate layers.

2. The array substrate according to claim 1, wherein
 one of the two of the data lines having the projections in a same pixel gap in the direction perpendicular to the pixel electrode layer is referred to as a first data line and the other one is referred to as a second data line; and
 the common wires are arranged in a same layer as the first data line or the second data line.

3. The array substrate according to claim 2, wherein a projection of the first data line on the pixel electrode layer partly overlaps with a projection of the second data line on the pixel electrode layer in the direction perpendicular to the pixel electrode layer.

4. The array substrate according to claim 2, wherein a gap exists between a projection of the first data line on the pixel electrode layer and a projection of the second data line on the pixel electrode layer in the direction perpendicular to the pixel electrode layer.

5. The array substrate according to claim 4, wherein the gap is less than 3 μm.

6. The array substrate according to claim 2, wherein a projection of the first data line on the pixel electrode layer adjoins a projection of the second data line on the pixel electrode layer in the direction perpendicular to the pixel electrode layer.

7. The array substrate according to claim 2, further comprising a substrate, wherein
 the common electrode layer, the pixel electrode layer, the common wires and the data lines are all arranged on a side of the switch elements facing away from the substrate.

8. The array substrate according to claim 7, wherein
 the active region is an amorphous silicon active region;
 in each of the switch elements, the gate is arranged between the active region and the substrate, a gate dielectric layer is arranged between the gate and the active region, and the source and the drain are all arranged on a surface of the active region facing away from the gate and are all electrically connected to the active region;
 the first data line is in contact with surfaces of drains of the switch elements corresponding to the first data line and is electrically connected to the drains; an insulation layer is arranged between the second data line and the drains of the switch elements corresponding to the second data line, and the second data line is electrically connected to the drains through via holes; and the common wires are arranged in a same layer as the second data line.

9. The array substrate according to claim 7, wherein the active region is a low temperature polysilicon active region;

in each of the switch elements, the active region is arranged between the gate and the substrate, a gate dielectric layer is arranged between the gate and the active region, and the source and the drain are all electrically connected to the active region;

an insulation layer is arranged between the first data line and the drains of the switch elements corresponding to the first data line, and the first data line is electrically connected to the drains through via holes; an insulation layer is arranged between the second data line and the drain of the switch elements corresponding to the second data line, and the second data line is electrically connected to the drains through via holes; and the common wires are arranged in a same layer as the first data line or the second data line.

10. The array substrate according to claim 9, wherein a light shielding wire is arranged between the active region and the substrate; and a protection of the active region on the light shielding wire in a direction perpendicular to the substrate is within the light shielding wire.

11. The array substrate according to claim 10, wherein the first data line is arranged on a side of the switch elements facing away from the substrate;

the common wires are arranged in a same layer as the first data line; and the second data line is arranged in a same layer as the light shielding wire.

12. The array substrate according to claim 10, wherein the second data line is arranged on a side of the switch elements facing away from the substrate;

the common wires are arranged in a same layer as the second data line; and the first data line is arranged in a same layer as the light shielding wire.

13. A display, comprising an array substrate and an opposite substrate arranged opposite to each other, wherein the array substrate comprises:

a common electrode layer and a pixel electrode layer arranged opposite to each other, wherein the pixel electrode layer comprises a plurality of pixel electrodes arranged in an array, and the common electrode layer comprises a plurality of common electrode blocks;

a plurality of switch elements each comprising an active region, a gate, a drain and a source;

a plurality of data lines extending in a column direction of the array, wherein the pixel electrodes in a same column are electrically connected to a same one of the data lines via the switch elements, the pixel electrodes in different columns are electrically connected to different ones of the data lines via the switch elements, and projections of the data lines on the pixel electrode layer in a direction perpendicular to the pixel electrode layer do not overlap with the pixel electrodes; and a plurality of common wires electrically connected to the common electrode blocks in a one-to-one correspondence, wherein the common wires extend in a direction parallel to the column direction, and projections of the common wires on the pixel electrode layer in the direction perpendicular to the pixel electrode layer do not overlap with the pixel electrodes, wherein a pixel gap exists between adjacent columns of the pixel electrodes;

the projections of the common wires on the pixel electrode layer are in separate pixel gaps from the projections of the data lines on the pixel electrode layer in the direction perpendicular to the pixel electrode layer; and two of the data lines having the projections in a same pixel gap are in separate layers.

14. The display according to claim 13, wherein one of the two of the data lines having the projections in a same pixel gap in the direction perpendicular to the pixel electrode layer is referred to as a first data line and the other one is referred to as a second data line; and the common wires are arranged in a same layer as the first data line or the second data line.

15. The display according to claim 14, wherein the array substrate further comprises a substrate, wherein the common electrode layer, the pixel electrode layer, the common wires and the data lines are all arranged on a side of the switch elements facing away from the substrate;

the active region is an amorphous silicon active region;

in each of the switch elements, the gate is arranged between the active region and the substrate, a gate dielectric layer is arranged between the gate and the active region, and the source and the drain are all arranged on a surface of the active region facing away from the gate and are all electrically connected to the active region;

the first data line is in contact with surfaces of drains of the switch elements corresponding to the first data line and is electrically connected to the drains; an insulation layer is arranged between the second data line and the drains of the switch elements corresponding to the second data line, and the second data line is electrically connected to the drains through via holes; and the common wires are arranged in a same layer as the second data line.

16. The display according to claim 14, wherein the array substrate further comprises a substrate, wherein the common electrode layer, the pixel electrode layer, the common wires and the data lines are all arranged on a side of the switch elements facing away from the substrate;

the active region is a low temperature polysilicon active region;

in each of the switch elements, the active region is arranged between the gate and the substrate, a gate dielectric layer is arranged between the gate and the active region, and the source and the drain are all electrically connected to the active region;

an insulation layer is arranged between the first data line and the drains of the switch elements corresponding to the first data line, and the first data line is electrically connected to the drains through via holes; an insulation layer is arranged between the second data line and the drain of the switch elements corresponding to the second data line, and the second data line is electrically connected to the drains through via holes; and the common wires are arranged in a same layer as the first data line or the second data line.

17. An electronic device, comprising an array substrate, wherein the array substrate comprises:

a common electrode layer and a pixel electrode layer arranged opposite to each other, wherein the pixel electrode layer comprises a plurality of pixel electrodes arranged in an array, and the common electrode layer comprises a plurality of common electrode blocks;

a plurality of switch elements each comprising an active region, a gate, a drain and a source;

a plurality of data lines extending in a column direction of the array, wherein the pixel electrodes in a same column are electrically connected to a same one of the data lines via the switch elements, the pixel electrodes in different columns are electrically connected to different ones of the data lines via the switch elements, and projections of the data lines on the pixel electrode layer in a direction perpendicular to the pixel electrode layer do not overlap with the pixel electrodes; and a plurality of common wires electrically connected to the common electrode blocks in a one-to-one correspondence, wherein the common wires extend in a direction parallel to the column direction, and projections of the common wires on the pixel electrode layer in the direction perpendicular to the pixel electrode layer do not overlap with the pixel electrodes, wherein, a pixel gap exists between adjacent columns of the pixel electrodes;

the projections of the common wires on the pixel electrode layer are in separate pixel gaps from the projections of the data lines on the pixel electrode layer in the direction perpendicular to the pixel electrode layer; and two of the data lines having the projections in a same pixel gap are in separate layers.

18. The electronic device according to claim 17, wherein one of the two of the data lines having the projections in a same pixel gap in the direction perpendicular to the pixel electrode layer is referred to as a first data line and the other one is referred to as a second data line; and the common wires are arranged in a same layer as the first data line or the second data line.

19. The electronic device according to claim 18, wherein the array substrate further comprises a substrate, wherein the common electrode layer, the pixel electrode layer, the common wires and the data lines are all arranged on a side of the switch elements facing away from the substrate;

the active region is an amorphous silicon active region;

in each of the switch elements, the gate is arranged between the active region and the substrate, a gate dielectric layer is arranged between the gate and the active region, and the source and the drain are all arranged on a surface of the active region facing away from the gate and are all electrically connected to the active region;

the first data line is in contact with surfaces of drains of the switch elements corresponding to the first data line and is electrically connected to the drains; an insulation layer is arranged between the second data line and the drains of the switch elements corresponding to the second data line, and the second data line is electrically connected to the drains through via holes; and the common wires are arranged in a same layer as the second data line.

20. The display according to claim 18, wherein the array substrate further comprises a substrate, wherein the common electrode layer, the pixel electrode layer, the common wires and the data lines are all arranged on a side of the switch elements facing away from the substrate;

the active region is a low temperature polysilicon active region;

in each of the switch elements, the active region is arranged between the gate and the substrate, a gate dielectric layer is arranged between the gate and the active region, and the source and the drain are all electrically connected to the active region;

an insulation layer is arranged between the first data line and the drains of the switch elements corresponding to the first data line, and the first data line is electrically connected to the drains through via holes; an insulation layer is arranged between the second data line and the drain of the switch elements corresponding to the second data line, and the second data line is electrically connected to the drains through via holes; and the common wires are arranged in a same layer as the first data line or the second data line.

* * * * *